US011906904B2

(12) United States Patent
Gruner (10) Patent No.: US 11,906,904 B2
(45) Date of Patent: Feb. 20, 2024

(54) PROJECTION EXPOSURE METHOD AND PROJECTION LENS WITH SETTING OF THE PUPIL TRANSMISSION (71) Applicant: Carl Zeiss SMT GmbH, Oberkochen (DE)

(72) Inventor: Toralf Gruner, Aalen-Hofen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 27 days.

(21) Appl. No.: 17/496,083

(22) Filed: Oct. 7, 2021

(65) Prior Publication Data

US 2022/0026814 A1 Jan. 27, 2022

Related U.S. Application Data (63) Continuation of application No. 16/681,348, filed on Nov. 12, 2019, now Pat. No. 11,143,967, which is a continuation of application No. PCT/EP2018/062201, filed on May 11, 2018.

(30) Foreign Application Priority Data

May 17, 2017 (DE) .................. 102017208340.9

(51) Int. Cl.
*G03F 7/20* (2006.01)
*G03F 7/00* (2006.01)
*G02B 5/18* (2006.01)
*G02B 5/20* (2006.01)

(52) U.S. Cl.
CPC ...... *G03F 7/70308* (2013.01); *G03F 7/70266* (2013.01); *G03F 7/70316* (2013.01); *G02B 5/18* (2013.01); *G02B 5/20* (2013.01)

(58) Field of Classification Search
CPC ............ G03F 7/70308; G03F 7/70266; G03F 7/70316; G03F 7/70108; G02B 5/18; G02B 5/20; G02B 17/0657; G02B 17/0812
See application file for complete search history.

(56) References Cited

U.S. PATENT DOCUMENTS

| | | | |
|---|---|---|---|
| 5,614,990 A | 3/1997 | Bruce et al. | |
| 6,118,577 A | 9/2000 | Sweatt et al. | |
| 8,169,703 B1* | 5/2012 | Mossberg | G02B 5/188 359/569 |
| 9,494,483 B2 | 11/2016 | Frese et al. | |

(Continued)

FOREIGN PATENT DOCUMENTS

| | | |
|---|---|---|
| DE | 102006028242 A1 | 1/2007 |
| DE | 102008054737 A | 7/2009 |

(Continued)

OTHER PUBLICATIONS

Japanese Office Action, with translation thereof, for corresponding Appl No. 2019-563374, dated Jun. 6, 2022.

(Continued)

Primary Examiner — Mesfin T Asfaw
(74) Attorney, Agent, or Firm — Fish & Richardson P.C.

(57) ABSTRACT

A projection exposure method for exposing a radiation-sensitive substrate with at least one image of a pattern of a mask is provided in which an illumination field of the mask is illuminated by illumination radiation with an operating wavelength $\lambda$ that was provided by an illumination system.

27 Claims, 5 Drawing Sheets

(56) References Cited

U.S. PATENT DOCUMENTS

| | | |
|---|---|---|
| 10,006,807 B2 | 6/2018 | Ehrmann et al. |
| 11,143,967 B2 | 10/2021 | Gruner |
| 2001/0026360 A1 | 10/2001 | Baker et al. |
| 2001/0048512 A1 | 12/2001 | Suzuki et al. |
| 2002/0041369 A1 | 4/2002 | Boettiger et al. |
| 2002/0196547 A1 | 12/2002 | Kleemann et al. |
| 2004/0190142 A1 | 9/2004 | Kleemann et al. |
| 2005/0073746 A1 | 4/2005 | Kleemann et al. |
| 2007/0121090 A1 | 5/2007 | Chen et al. |
| 2008/0094599 A1 | 4/2008 | Scheible et al. |
| 2008/0239272 A1 | 10/2008 | Wang et al. |
| 2009/0244502 A1 | 10/2009 | Kuechler et al. |
| 2010/0195070 A1 | 8/2010 | Loering |
| 2012/0262688 A1 | 10/2012 | DeVries et al. |
| 2013/0052566 A1 | 2/2013 | Zhou et al. |
| 2013/0250264 A1 | 9/2013 | Schubert et al. |
| 2014/0347646 A1 | 11/2014 | Dmitriev |
| 2015/0009492 A1 | 1/2015 | Frese et al. |
| 2020/0081350 A1 | 3/2020 | Gruner |

FOREIGN PATENT DOCUMENTS

| | | |
|---|---|---|
| DE | 102012202675 A1 | 1/2013 |
| DE | 102011084152 A1 | 4/2013 |
| DE | 102013205568 A1 | 3/2014 |
| DE | 102015223795 A1 | 1/2016 |
| EP | 1256821 A2 | 11/2002 |
| GB | 2428491 A | 1/2007 |
| JP | 2007-158328 A | 6/2007 |
| JP | 2010-226123 A | 10/2010 |
| JP | 2015-517095 A | 6/2015 |
| JP | 2016-538576 A | 12/2016 |
| WO | WO 03/092256 A2 | 11/2003 |
| WO | WO 2005/069055 A2 | 7/2005 |
| WO | WO 2005/119369 A1 | 12/2005 |
| WO | WO 2009/033709 A1 | 3/2009 |
| WO | WO 2013/050198 A1 | 4/2013 |
| WO | WO 2015/007298 A1 | 1/2015 |

OTHER PUBLICATIONS

German Office Action, with translation thereof, for corresponding Appl No. 10 2017 208 340.9, dated Jan. 25, 2018.

International Search Report and Written Opinion for corresponding PCT Appl No. PCT/EP2018/062201, dated Aug. 27, 2018.

H-J Rostalski et al., "Use of Diffractive Lenses in Lithographic Projection Lenses", International Optical Design, Technical Digest (CD) (Optical Society of America, 2006), paper WD4.

German Office Action, with translation thereof, for corresponding Appl No. 10 2017 208 340.9, dated Jul. 31, 2020.

\* cited by examiner

PROJECTION EXPOSURE METHOD AND PROJECTION LENS WITH SETTING OF THE PUPIL TRANSMISSION

CROSS-REFERENCE TO RELATED APPLICATIONS

The present application is a continuation of, and claims benefit under 35 USC 120 to, U.S. application Ser. No. 16/681,348, filed Nov. 12, 2019, which is a continuation of, and claims benefit under 35 USC 120 to, international application PCT/EP2018/062201, filed May 11, 2018, which claims benefit under 35 USC 119 of German Application No. 10 2017 208 340.9, filed May 17, 2017. The entire disclosure of these applications are incorporated by reference herein.

FIELD

The disclosure relates to projection exposure method for exposing a radiation-sensitive substrate with at least one image of a pattern of a mask according to the preamble of claim 1, a projection lens, according to the preamble of claim 13, that is suitable for carrying out the method and a method for producing a correction element with a correction surface that has a locally varying transmission.

BACKGROUND

Microlithographic projection exposure methods are predominantly used nowadays for producing semiconductor components and other finely structured components, such as, for example, masks for photolithography. In this case, use is made of masks (reticles) or other pattern generating devices that bear or form a pattern of a structure to be imaged, for example a line pattern of a layer of a semiconductor component. The pattern is positioned in the region of an object plane of the projection lens between an illumination system and a projection lens in a projection exposure apparatus and is illuminated by illumination radiation provided by the illumination system. The radiation modified by the pattern travels in the form of projection radiation through the projection lens, which images the pattern with a reduced scale onto the wafer to be exposed or onto the substrate to be exposed. The surface of the wafer is arranged in an image plane of the projection lens that is optically conjugate to the object plane. The wafer is generally coated with a radiation-sensitive layer (resist, photoresist).

One of the aims in the development of projection exposure apparatuses is to lithographically produce structures having smaller and smaller dimensions on the wafer. In the case of semiconductor components, for example, smaller structures lead to higher integration densities, which generally has a favourable effect on the performance of the microstructured components produced. Projection lenses exhibiting good imaging performance are needed for this purpose.

Optical imaging systems, such as e.g. microlithographic projection lenses, can provide good imaging performance if the complex amplitude in the image field achieved during operation coincides, within the given tolerances, with the complex amplitude in the image field which is desired in accordance with the specification. The complex amplitude can be described using a phase and a magnitude (or an absolute value). The phase of the complex amplitude is often also described as a wavefront. Of the magnitude of the complex amplitude, inter alia, the profile thereof over the pupil is important. This profile over the pupil describes the intensity distribution in the exit pupil of an optical imaging system. This intensity distribution can be described quantitatively by the pupil transmission function, which describes the total transmission as a function of pupil coordinates.

The pupil transmission function or the corresponding intensity distribution in the exit pupil of an optical imaging system can be changed in targeted fashion, for example by optical filtering via a filter which is introduced into the imaging beam path in a pupil plane, or in the vicinity of a pupil plane, and which has a local transmission profile or a variation of the transmission over the effective cross section of the filter. Such filtering is occasionally referred to as pupil filtering or apodization.

Especially in relatively high-aperture optical imaging systems, such as e.g. microlithographic projection lenses, different rays emanating from the object field travel (with substantially identical optical path length) different geometric paths and are incident on the optical surfaces of lens elements and other optical elements of the imaging system with strongly varying angles of incidence. Rays that travel along the optical axis or for the entire length relatively close to the optical axis typically undergo greater absorption within the optical dense lens element material than rays which travel mainly at the periphery of the lens elements. Conversely, it is possible, especially in the case of marginal rays, for especially high angles of incidence to occur on the optical surfaces, as a result of which greater reflection losses arise, as a rule, for these rays than for rays which pass at least approximately perpendicularly through the optical surfaces. Consequently, it is clear, inter alia, that different rays that emanate from the same object point "see" a different total transmission on their path through the optical imaging system. This effect can be represented by the "pupil transmission" or the associated pupil transmission function.

Specifically when using phase-shift masks ("Levinson" type) in which no first order of diffraction is produced, the influence of the pupil transmission function on the imaging quality may be pronounced. Variations of the surface angles of incidence (incidence angles) of the rays at the optical surfaces which are due to the optical design, variations in the layer production of optical coatings, variations in the lens element material and any contamination on optical surfaces are typical influencing factors which can result in changes in the pupil transmission function. There is therefore a need for options for compensating for such undesired effects.

US 2008/0094599 A1 describes, inter alia, a projection lens for imaging a pattern that is arranged in the object plane of the projection lens into the image plane of the projection lens, in which a multiplicity of optical components are arranged between the object plane and the image plane, wherein at least one of the optical components has a substrate, in which at least one substrate surface is coated with an interference layer system that, over a usable cross section of the optical component, has a strong spatial modulation of the degree of reflection and/or degree of transmission, wherein the modulation is adapted to a spatial transmission distribution of the remaining components of the projection lens in such a way that an intensity distribution of the radiation that is present in a pupil plane has a substantially reduced spatial modulation in comparison with a projection lens without the interference layer system.

WO 2013/050198 A1 describes, inter alia, a method for setting the intensity distribution in an optical system of a microlithographic projection exposure apparatus. In the method, a transmission-influencing layer, for example in the form of a contamination layer with hydrocarbon compounds, is produced on at least one surface of an optical element that is arranged in the optical system. Thereupon, there is a partial removal of this layer by irradiating part of the layer such that the optical element has a predetermined transmission distribution as a consequence of the remaining component of the layer.

WO 03/092256 A2 describes projection methods and projection systems with optical filtering. Here, use is made of an imaging system, in which a multiplicity of optical elements and at least one pupil plane are arranged between the object plane and the image plane, the pupil plane being Fourier transformed in relation to the field planes of the imaging system. Angle-selective optical filtering is carried out in the region of a field plane with the aid of an optical filter element, the angle-dependent filter function of which is calculated as a function of a desired spatially dependent filter function for the region of the pupil. Hence, it is possible to influence the pupil transmission function or the intensity distribution in the exit pupil.

SUMMARY

The disclosure seeks to provide an option for targeted influencing of the intensity distribution in the exit pupil of an optical imaging system without impairing other important properties for the imaging, such as the wavefront.

In an aspect, the disclosure provides a projection exposure method for exposing a radiation-sensitive substrate (W) with at least one image of a pattern (PAT) of a mask (M), including the following steps: holding the mask (M) between an illumination system (ILL) and a projection lens (PO) of a projection exposure apparatus (WSC) in such a way that the pattern is arranged in the region of the object plane (OS) of the projection lens; holding the substrate (W) in such a way that a radiation-sensitive surface of the substrate is arranged in the region of an image plane (IS) of the projection lens optically conjugate to the object plane; illuminating an illumination field (OF) of the mask with illumination radiation provided by the illumination system having an operating wavelength λ; projecting a part of the pattern lying in the illumination field onto an image field (IF) on the substrate with the aid of the projection lens, wherein all rays that contribute to the image production in the image field form an imaging beam path in the projection lens, wherein the following steps are carried out for setting a local intensity distribution in an exit pupil of the projection lens: choosing at least one optical surface (S1) of an optical element (PP) of the projection lens as a correction surface; and producing diffraction structures (DS) in an optically used region (UA) of the correction surface according to a predeterminable local distribution in such a way that, during operation, the diffraction structures guide a component of the intensity of the rays incident on the diffraction structures into uncritical regions outside of the imaging beam path via diffraction.

In an aspect, the disclosure provides a method for producing an optical element with a correction surface that has a locally varying transmission, for use at a position in an imaging beam path of an optical imaging system. The method includes the following steps: a)
  choosing a position in the imaging beam path of at least one correction surface to be provided with diffraction structures; b) ascertaining an assignment between the position of the correction surface in the imaging beam path and a field-dependent pupil location; c) measuring the local intensity distribution in an exit pupil for different field points in the image field (depending on the field location in the image field); d) ascertaining an intended deflection profile that represents a sought-after local distribution of the masking of radiation intensity via diffraction in order to obtain an intended profile of the local intensity distribution in the exit pupil; e) ascertaining a first spectrum with angles of incidence of rays incident at an area location of the correction surface, a second spectrum with angles of reflection of rays that emanate from the area location in the direction of the image field, and a third spectrum with angles of reflection of rays that lead from the area location in the direction of an uncritical region; f) ascertaining structure periods and structure orientations of diffraction structures that produce a diffraction into angles in the region of the third spectrum for rays at the operating wavelength; g) ascertaining a spatially dependent diffraction intensity of the diffraction structures that leads to the intended deflection profile being obtained; h) producing the diffraction structures at the correction surface depending on results of the steps f) and g).

In an aspect, the disclosure provides a projection lens (PO) for imaging a pattern arranged in an object plane (OS) of the projection lens into an image plane (IS) of the projection lens via of electromagnetic radiation with an operating wavelength λ. The projection lens (PO) includes: a multiplicity of optical elements with optical surfaces that are arranged in an imaging beam path between the object plane (OS) and the image plane (IS) in such a way that a pattern arranged in the object plane is imageable in the image plane via the optical elements, and a system for setting a local intensity distribution in an exit pupil of the projection lens. At
  at least one optical surface (S1) of an optical element (PP) of the projection lens is designed as a correction surface. Diffraction structures (DS) are embodied in an optically used region (UA) of the correction surface according to a predeterminable local distribution in such a way that, during exposure operation, the diffraction structures guide a component of the intensity of the rays incident on the diffraction structures into uncritical regions outside of the imaging beam path via diffraction.

Among other things, the inventor has recognized that, for the purposes of influencing the intensity distribution in the exit pupil of an optical imaging system, it may be advantageous to attach diffraction structures, i.e. (diffractive) structures that have a diffraction effect for the light at the operating wavelength, with a suitable spatial distribution on an optical surface, provided as a correction surface, in the imaging beam path. These diffracting structures remove excess light from the imaging beam path via diffraction in those zones in which they are provided. However, unlike in the case of grey filters, this light is not absorbed at the location of the diffraction structures, i.e. at the correction surface of the optical element, but, in the case of a suitable design of the diffraction structures, it can be steered into one or more uncritical regions that are thermally decoupled from the optically effective elements in the imaging beam path. With the aid of output coupling of radiation components that is effectuated by diffraction, it is possible to obtain a change in, or correction of, the intensity distribution in the exit pupil substantially without damaging element heating.

An optical element having at least one correction surface with such diffraction structures is also referred to as "correction element" in this application.

The diffraction structures are designed to effectuate a substantial change in, or correction of, the intensity distribution in the exit pupil of the projection lens. As a result, they differ both structurally and functionally from diffractive structures that are designed for other purposes.

By way of example, the use of diffractive optical elements (DOEs) in microlithographic projection lenses for the purposes of chromatic correction, i.e. the correction of chromatic aberration (colour errors), is known. The specialist article "Use of Diffractive Lenses in Lithographic Projection Lenses" by H-J Rostalski, A. Epple and H. Feldmann in: International Optical Design, Technical Digest (CD) (Optical Society of America, 2006), paper WD4, describes that it is possible to use diffractive lens elements for chromatic correction and that these, without an own contribution to the image field curvature, may also simplify the Petzval correction.

GB 2 428 491 A describes catadioptric projection lenses with a folded beam path and a concave mirror, in which, for the purposes of an efficient chromatic correction, a diffractive optical element which has radiation passing through in opposite directions is arranged in a region, through which radiation passes twice, in the vicinity of the concave mirror.

EP 1 256 821 A2 (corresponding to US 2005/0073746 A1) describes a diffractive optical element having a plurality of diffraction structures, which each have a width that is measured in the plane of the diffractive optical element and a height that is measured perpendicular thereto, wherein the widths and the heights of the diffraction structures vary in an opposite sense over the surface of the diffractive optical element in such a way that wider diffraction structures have a lower height than less wide diffraction structures. As a result, the comparatively low diffraction losses in the region of the wide structures are increased and thus matched to the comparatively high diffraction losses in the region of the less wide structures in such a way that a diffractive optical element with a local diffraction efficiency that remains unchanged over its surface emerges. An optical arrangement, in which a neutral filter (grey filter) is provided in addition to a diffractive optical element with diffractive structures of varying width, is also described.

DE 10 2006 028 242 A1 describes catadioptric and refractive projection lenses with two intermediate images, in which a diffractive optical element is arranged in the vicinity of the first pupil plane that is closest to the object plane. In this way, positive refractive power is introduced, as a result of which it is possible to save refractive power elsewhere. Hence, it is possible to obtain a reduction in the maximum diameter of the refractive lens elements. An influence on the longitudinal chromatic aberration, likewise present, is discussed.

A diffractive optical element for chromatic correction ideally diffracts completely into the imaging beam path (used beam path), while a diffractive optical element for correcting the pupil intensity distribution diffracts some of the light out of the imaging beam path in a controlled fashion.

A diffractive element for chromatic correction is directed to a single order of diffraction, the diffractive element for a pupil intensity correction passes a first component in the zero order of diffraction and diffracts at least one second component (but also often more) into first and/or higher orders, wherein both components lie above 1 part in one thousand, preferably above one percent (optionally a maximum over the location on the component).

In order to ensure a targeted reproducible intervention in respect of the intensity distribution in the exit pupil, the diffraction structures are preferably designed in such a way that more than 40% of the diffracted radiation does not reach as far as the image field. In particular, provision can be made for more than 60% or even more than 80% of the diffracted light (outside of the zero order of diffraction) not to be able to reach the image field.

In particular, the diffraction structures in the optically used region of the correction surface can be designed in such a way that at least one of the following conditions, preferably several or all, of the following conditions are satisfied:

The highest diffraction intensity is present in the zero order of diffraction and the order of diffraction with the highest diffraction intensity that differs from the zero order of diffraction leaves the imaging beam path (used beam path); i.e., it is diffracted into uncritical regions outside of the imaging beam path.

The intensity distribution in the exit pupil is modified in comparison with an arrangement without diffraction structures in such a way that the intensity distribution in the exit pupil changes by more than 0.2%, preferably by more than 2%, in particular by more than 10% (in terms of peak-to-valley value). In particular, these limits may apply to the non-rotationally symmetric contributions of the intensity distribution.

Portions with an area of more than 5%, preferably more than 10%, in particular more than 15% of the optically used region of the correction surface do not carry any diffraction structures.

The RMS value of the non-rotationally symmetric component of the diffraction structures (given by e.g. the RMS value of the non-rotationally symmetric components of a height variation of diffractive structures and/or refractive index variation or the like) exceeds the RMS value of the rotationally symmetric component.

The diffraction structures can be designed and arranged in such a way that a substantial component of the components that were diffracted via the diffraction structures (e.g. more than 50% or more than 60% or more than 70% of these components) is captured in the uncritical regions via at least one low-reflection radiation capture device. The radiation components that are locally decoupled by diffraction at the correction surface can be captured, for example, at an aperture stop, at a field stop, at a stray light stop, at a mounting component for an optical element, at edges of breakthroughs and/or at other low-reflection beam capturing devices that are possibly provided in a dedicated fashion for this purpose only. In order to largely suppress reflections of diffracted radiation components at a low-reflection radiation capture device, the latter may have, at least in a region exposed to the diffracted radiation, a separate coating that has an absorbing effect for the operating wavelength, or any other absorbing structure.

Preferably, a low-reflection radiation capture device is arranged at a distance of at least 5 mm from the optical element with the correction surface. The distance may also be larger, for example at least 10 mm or at least 20 mm. As a result, it is possible to ensure that a possible absorption of diffracted radiation components and an increase in temperature at the affected points, connected therewith, has no influence, or only a negligibly small influence, on the optically used region of the correction surface or of the optical element that has been provided with the correction surface. As a result, it is possible to largely avoid indirect thermally caused system aberrations on account of the diffractive decoupling of radiation components.

In order to obtain effective decoupling of radiation components via diffraction with sufficiently large diffraction angles, provision is made in some embodiments for the diffraction structures to have a pattern with dense lines, the dense lines having a line spacing that is less than ten times the operating wavelength. In particular, the line spacing or the period within the regions with dense lines can be less than five times the operating wavelength or less than two times the operating wavelength or less than the operating wavelength, for example down to a tenth of the operating wavelength, where applicable As a rule, the diffraction angles that are obtainable hereby are sufficient for steering the radiation components to be decoupled past adjacent optical elements into uncritical regions outside of the imaging beam path.

By way of example, the line spacing can be less than 400 nm or less than 200 nm, e.g. when operating wavelengths in the deep ultraviolet (DUV) range are used. On the other hand, when operating wavelengths from the extreme ultraviolet (EUV) range are used, diffractive structure may be even finer, e.g. with line spacings in the order of some tens of nanometers down to ten nanometers of less, such as one or two or three or five nanometers.

By way of example, the dense lines can extend parallel to one another in straight lines, as a result of which it is possible to predetermine a diffraction direction in a plane perpendicular to the extent of the lines. It is also possible to form the diffraction structures, either in part or in full, with the aid of circularly curved lines, for example in the form of concentric circles, the line spacing of which is then measured in the radial direction.

In view of avoiding the heating of elements, provision is made in some embodiments for the diffraction structures to be designed, in part or in full, as phase gratings. By way of example, phase gratings can be produced by local compacting of quartz material via locally focussed laser pulses, as a result of which there is a change in the material refractive index in the irradiated region in relation to adjacent non-irradiated regions and a phase grating is realized. Optionally, this type of production of phase gratings in the material of the optical element is even possible through an anti-reflection coating or through a reflecting coating.

As an alternative to diffraction structures that are designed with phase gratings or as a phase grating, or in addition thereto, it is also possible to use diffraction structures in the form of amplitude gratings. By way of example, the lines of an amplitude grating can be produced by a suitable line-like coating. Although it may be the case that a certain component of the incident radiation is absorbed in the case of amplitude gratings, this absorption component is lower than in the case of grey filters with a large-area absorption coating, and so amplitude gratings, too, may be used as diffraction structures as a matter of principle.

In order to set a desired local distribution of the diffraction effect at a correction surface, it is possible to appropriately choose different parameters of the diffraction structures. By way of example, it is possible that regions with diffraction structures lie next to regions without diffraction structures on the correction surface. Thus, it may be the case that only one part of a correction surface is occupied with diffraction structures.

Alternatively, or additionally, it may be the case that the diffraction structures amongst themselves are all identical in those regions in which diffraction structures are provided, and so the local distribution of the diffraction effect is primarily influenced by the local distribution of the diffraction structures themselves. Alternatively, or additionally, it is also possible that diffraction structures with different densities per unit area are produced at the correction surface. Consequently, it is possible to obtain locally different diffraction effects within regions with diffraction structures.

When choosing suitable locations for applying a correction surface and for applying low-reflection beam capturing devices, it is possible to take account of peculiarities of the structure of projection lenses. By way of example, a projection lens can be designed in such a way that it directly images the object field into the image field without intermediate imaging. It is also possible for the projection lens to be configured in such a way that at least one real intermediate image is produced in the region of an intermediate image plane between the object plane and the image plane. In these cases, it may be advantageous if the optical element that has been provided with the correction surface (i.e. the correction element) is arranged at a pupil plane, or in the vicinity of a pupil plane, between the object plane and the intermediate image. In this case, the diffracted radiation can be captured, in part or in full, via a field stop or a stray light stop in the region of the intermediate image.

Alternatively, or additionally, it is also possible to attach optically in the vicinity of a field plane of the projection lens, for example in the vicinity of the object plane or, provided a real intermediate image is formed, in the vicinity of the intermediate image, at least one optical element having a correction surface that has been provided with diffraction structures. Preferably, the optical element provided with the correction surface is arranged upstream of the aperture stop in the imaging beam path such that the aperture stop can be used as a low-reflection radiation capture device.

High-performance projection lenses for wafer scanners, e.g. catadioptric projection lenses, often have a rectangular (effective) object field, which frequently is not centred in relation to the optical axis but lies off axis. If the object field and the image field are slot-shaped with an aspect ratio of greater than one between a field width in a first direction and a field height in a second direction that is perpendicular to the first direction, it may be expedient if structure orientations of structure elements of the diffraction structures are designed in such a way that the diffraction structures predominantly or exclusively diffract into the second direction. As a result of this, it is already possible to obtain reliable complete masking of unwanted radiation components, even with relatively small angles of diffraction.

With the aid of the diffraction structures, it is possible to influence the local intensity distribution in the exit pupil of the projection lens in a targeted manner. Consequently, this intensity distribution may be different if a correction surface is present than if the correction surface is not present. This option can be used to obtain an equalization of the intensity distribution in the exit pupil, i.e. to reduce the variation. In principle, it is also possible to amplify the variation or to set a different type of variation with a different profile of the pupil transmission function. However, the correction aspect will frequently be prioritized.

In some variants, a pupil transmission of the projection lens without correction surface is determined by measurement, wherein the diffraction structures are embodied in such a way that a spatially dependent diffraction profile is produced, the diffraction profile, if the correction surface is arranged in the imaging beam path, reducing variation of the pupil transmission in relation to a configuration without correction surface. This reduction in the variation is also referred to here as "equalization", even if the resulting pupil transmission function varies between different values of the pupil transmission, i.e. even if it is not uniform.

Within the scope of implementing the disclosure, it is possible to carry out a method for producing an optical element with a correction surface that has a locally varying transmission. The locally varying transmission is substantially determined by the type of the diffraction structures and the local distribution thereof on the correction surface. The optical element is provided for use at a predeterminable position in an imaging beam path of an optical imaging system. For the design, the following procedure can be undertaken, for example.

In a step a)—selection step—a position in the imaging beam path of at least one correction surface to be provided with diffraction structures is chosen.

In a step b)—assignment step—there is an ascertainment of an assignment between the position of the correction surface in the imaging beam path and a field-dependent pupil location.

By way of example, this can be understood as set forth below. A point on an optical surface corresponds at each field point $x_i$, from the subaperture of which it is seen, to a location in the pupil: $p_i(x_i)$. In general, the following will apply to various field points $x_i$, $x_j$ ... etc. of this type: $p_j(x_j) \neq p_i(x_i)$. By way of example, it is possible to define a migration speed v according to:

$$v = (p_i(x_i) - p_{i+1}(x_{i+1}))/(x_i - x_{i+1}).$$

This depends on the location of the optical surface (in the optical system). If is comparatively large, the surface has a near-field position. If $|v| \approx 0$, the surface has a near-pupil position. The migration speed is only one example. Other characteristics are conceivable (e.g. other functional profiles) and should be chosen fitting to the optical system. Such variables correlate with the subaperture ratio. Normally, a behaviour worthy of correction in the exit pupil is produced anywhere in the optical system, frequently on, or in the vicinity of, a surface therein. A subaperture ratio can be assigned thereto, the subaperture ratio then correlating to the migration speed or any other characteristic that is defined on the basis of the field-dependent pupil intensity distribution.

By way of example, ray simulations can be carried out for step b). If the relevant surface is arranged in a pupil plane of the optical imaging system, for example, each location on the surface will correspond to a fixed location in the exit pupil of the optical imaging system, the fixed location not varying with the field location. In many cases, the surface provided as a correction surface will not be positioned exactly in a pupil plane. In these cases, the assigned point in the exit pupil would vary depending on the position of the field point.

So that the actual state of the optical imaging system is known before the introduction of a correction, a measurement of the local intensity distribution in the exit pupil for different field points in the image field, i.e. depending on the field location in the image field, is carried out in step c)—measurement step. The measurement step can be carried out in a suitable measurement system.

In a step d)—profile ascertainment step—there is ascertainment of an intended deflection profile that represents a sought-after local distribution of the masking of radiation intensity via diffraction, which is involved to obtain the sought-after intended profile of the local intensity distribution in the exit pupil. In principle, after carrying out this method step, the locations of the correction surface, or the portions, in which diffraction structures should be provided are known and how strongly the diffraction structures should remove radiation intensity from the imaging beam path via diffraction is known. When carrying out this step, it is possible, for example, to expand the local intensity distribution in the exit pupil for each field point, or for selected field points, in Zernike polynomials over the pupil. Then, on the basis of the assignment ascertained in step b), it is possible to ascertain curves, for example within the scope of a Tikhonov regularization or a QuadProg optimization, which minimize a target function composed of the Zernike coefficients.

The result of this optimization step can be compared to the current specification for the local intensity distribution in the exit pupil within the scope of an optional comparison step. If the specification is not achieved after the correction, it is possible to add one or more additional correction surfaces. If the target from the specification is achieved without difficulties within the optimization operation, attempts can be made to omit one or more correction surfaces and hence reduce complexity, costs, duration and error susceptibility of the correction process. As a result of this optionally iterative process, a list of correction surfaces and associated profiles (intended deflection profiles) of the respective amount of light to be masked is generated. This list may comprise a single correction surface or a plurality of correction surfaces at different positions, for example two or three or four correction surfaces.

After this method step, the correction surfaces and locations of the correction surfaces at which radiation intensity should be masked via diffraction out of the imaging beam path in order to obtain, in the projection lens, the desired local intensity distribution in the exit pupil are known. How diffraction structures that are suitable to this end are structured and distributed is to be ascertained.

To this end, a first spectrum with angles of incidence of rays incident at an area location of the correction surface is ascertained in step e)—angle spectra ascertainment step. Furthermore, a second spectrum with angles of reflection of rays that emanate from the area location in the direction of the image field is ascertained. Consequently, the ray angles of those rays that, proceeding from the correction surface within the imaging beam path, would reach the image field and contribute to the image generation lie in the second spectrum. The diffracted light intensity should not be steered into directions within the second spectrum. Preferably, a third spectrum with angles of reflection of rays that lead from the area location in the direction of an uncritical region is ascertained. Consequently, what is achieved by step e) is that the directions in which the diffraction structures to be produced may diffract are known and which diffraction directions should be avoided is known.

On the basis of the result of this method step, structure periods and structure orientations of diffraction structures that produce a diffraction into directions or into angles outside of the second spectrum, in particular within the third spectrum, for rays at the operating wavelength are determined in step f)—structure ascertainment step. Starting from the operating wavelength λ, this can be effectuated via the Bragg equation $$n\lambda = 2d \sin \alpha,$$

where n is the order of diffraction, λ is the operating wavelength, d is the structure period and a is the angle of diffraction. Here, only those structure periods and structure orientations for which the angles of diffraction of the orders of diffraction (not equal to zero) are embodied for all angles of incidence occurring during use (during operation) at the correction surface in such a way that the diffracted light is steered into uncritical regions are considered as possible structure parameters for the diffraction structures.

In a step g)—diffraction intensity ascertainment step—a spatially dependent diffraction intensity of the diffraction structures is ascertained, the latter leading to the intended deflection profile being obtained. The diffraction intensity is selected in a spatially dependent manner in such a way that precisely the desired profile of masked light emerges. By way of example, this intensity can be converted into an amplitude of the diffractive structures which precisely supplies the desired diffraction intensity. As a rule, the change in intensity ΔI that is intended to be brought about by the diffraction can be quantitatively described by the approximation $$\Delta I \approx 2\pi h/\lambda$$

Here, h is the amplitude of the optical path length change. As a rule, this approximation applies with sufficient accuracy for the situation considered here since, as a rule, only a relatively small component of the intensity of the incident radiation should be masked out of the imaging beam path via diffraction.

Alternatively, or in a complementary manner, the diffraction intensity can be ascertained with increased accuracy using rigorous methods which are known. Such methods include, inter alia, mode-based calculations, finite element methods and finite difference methods.

The ascertainment of structure periods and structure orientations according to step f) and the ascertainment of the spatially dependent diffraction intensity according to step g) can be carried out with time overlap or successively in time, with the temporal sequence being arbitrary as a matter of principle.

Then, the diffraction structures on the correction surface can be produced depending on the result of steps f) and g).

By way of example, it is possible that a phase grating that produces particularly little absorption is used for producing the diffraction structures. All diffraction structures or only some of the diffraction structures can be designed as phase gratings. Depending on the application, it is optionally also possible for some of the diffraction structures or all of the diffraction structures to be designed as amplitude gratings. By way of example, an amplitude grating can be produced by applying chromium structures onto the optical surface provided as the correction surface.

The concepts described here may be utilized at various different operating wavelengths, particularly those presently used in microlithography to obtain high resolution and pattern fidelity. For example, the concepts can be used when electromagnetic radiation with an operating wavelength from the deep ultraviolet (DUV) range is utilized. These operating wavelengths include, for example, wavelengths below about 260 nm, such as 248 nm, 193 nm or 157 nm. The concepts can also be used in projection exposure systems utilizing electromagnetic radiation with an operating wavelength from the extreme ultraviolet range (EUV), e.g. between about 5 nm and about 20 nm, such as about 13.4 nm or about 6.7 nm. Structure dimensions of diffractive structures should be adapted accordingly to obtain desired diffraction angles and diffraction efficiencies.

BRIEF DESCRIPTION OF THE DRAWINGS

Further advantages and aspects of the disclosure are evident from the claims and from the following description of preferred exemplary embodiments of the disclosure, which are explained below with reference to the figures.

DETAILED DESCRIPTION OF THE EXEMPLARY EMBODIMENTS

Figure 1:
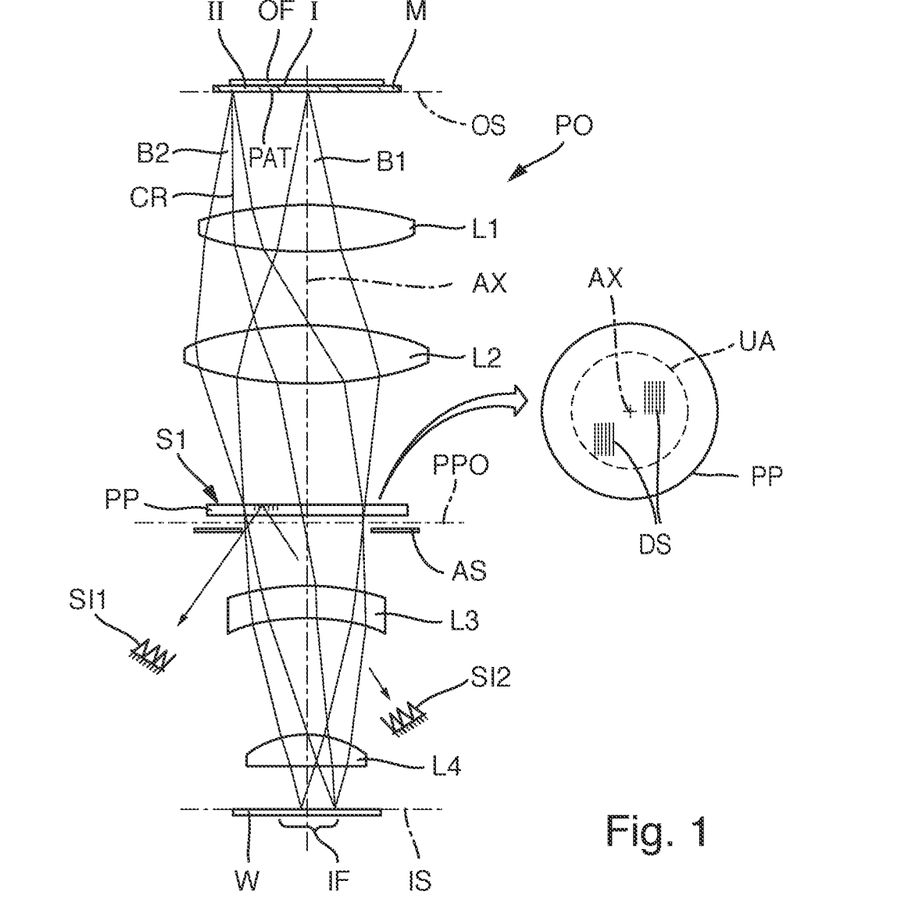
FIG. 1 shows a meridional section through an embodiment of an optical imaging system having a diffractive correction element.
Figure 2:
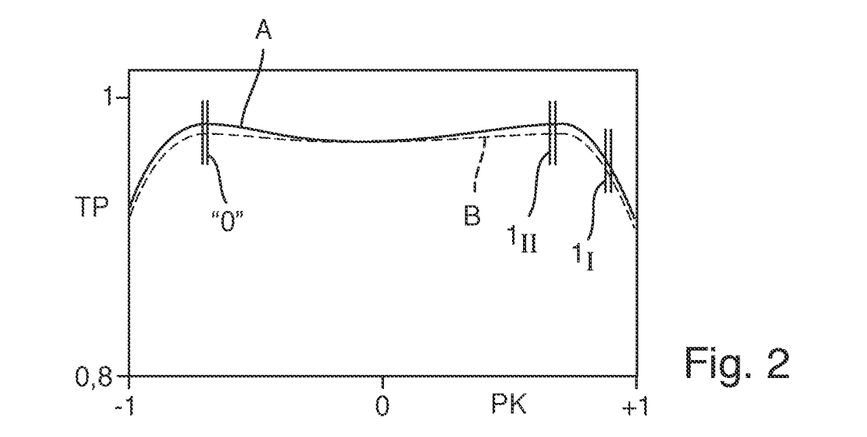
FIG. 2 shows a schematic diagram illustrating the pupil transmission of the projection lens from FIG. 1 as a function of the pupil coordinates.

Initially, FIGS. 1 and 2 are used to explain some fundamentals for the better understanding of issues when using high-performance optical imaging systems. FIG. 1 shows a meridional section through an embodiment of an optical imaging system in the form of a refractive (dioptric) projection lens PO for a microlithographic projection exposure apparatus. Only a few representative lens elements L1, L2, L3, L4 of the projection lens are shown in the longitudinal section. The reducing optical imaging of an object field OF that is arranged in the object plane OS and centred to the optical axis into an image field IF that lies in the image plane IS and that is centred to the optical axis by way of the projection lens is represented by two beams B1 and B2, one of which (beam B1) emanates from an object point lying on the optical axis AX and the other of which (beam B2) emanates from an off axis object point with the greatest possible distance from the optical axis. The ray CR of the off-axis beam B2, emanating substantially perpendicular to the object surface OS in this object-side and image-side telecentric projection lens, is the chief ray (principal ray) of the imaging, the point of intersection of which with the optical axis AX setting the axial position of the pupil plane PPO of the projection lens. An aperture stop AS for delimiting the beam cross section in the vicinity of the pupil and for setting the used image-side numerical aperture NA is provided in the vicinity of the pupil plane. The rays travelling from the object points to the edge of the aperture stop in each case are referred to as "aperture rays" or "marginal rays" in this case.

It is clear that the various rays pass over different geometric paths (in the case of substantially the same optical path length) and are incident on the optical surfaces with greatly varying angles of incidence. Rays that travel very close to the optical axis, or along the optical axis, on the entire length experience greater absorption within the optical dense lens element material than rays which travel mainly at the periphery of the lens elements. Conversely, it is possible, especially in the case of marginal rays, for especially high angles of incidence to occur on the optical surfaces, as a result of which greater reflection losses arise, as a rule, for these rays than for rays that travel in the vicinity of the optical axis and pass at least approximately perpendicularly through the optical surfaces. Consequently, it can be seen, in particular, that different rays that start from the same object point "see" a different total transmission on their path through the projection lens.

This effect is illustrated in FIG. 2 with the aid of the so-called "pupil transmission" TP, which can be described quantitatively by a "pupil transmission function", in which the transmission of the projection lens is plotted as a function of the normalized pupil coordinate PK. The solid line A represents the typical curve of the pupil transmission, which is substantially rotationally symmetric, for a refractive projection lens. It is clear that the pupil transmission in the vicinity of the optical axis (PK=0) has a relatively high value which, initially, still increases with increasing radial distance from the optical axis, before, in the case of even higher distances from the optical axis, the transmission reduces significantly in the vicinity of the edge of the pupil.

If the projection lens is considered from a chosen image field point (field point in the image field IF), the exit pupil of the projection lens for this image field point is seen. Then, the pupil transmission manifests itself as a local distribution of the intensity in the exit pupil of the optical imaging system. This local distribution of the intensity can be uniform (no intensity variation of the pupil). However, as a rule, there is a non-uniform intensity distribution in the exit pupil for each image field point. In general, the intensity distribution in the exit pupil also varies from image field point to image field point, and so the illumination of the pupil appears to be different from different image field points. In this application, this is referred to as a field dependence of the intensity distribution in the exit pupil.

A strong variation of the effective transmission of the projection lens for different beam paths through the projection lens may have a great influence on the imaging quality. A pronounced field dependence of the intensity distribution in the exit pupil may cause variations in the critical dimensions of produced structures over the image field (CD variations), for example.

A possible issue of a non-uniformly illuminated exit pupil is explained in more detail on the basis of FIG. 2. A projection exposure method for exposing a radiation-sensitive substrate W with at least one image of a pattern PAT of a mask M is considered. The mask is held between an illumination system, which is not shown in FIG. 1, and the projection lens PO in such a way that the pattern PAT is arranged in the region of the object plane OS of the projection lens. The substrate W is held in such a way that a radiation-sensitive surface of the substrate is arranged in the region of the image plane IS of the projection lens optically conjugate to the object plane. An illumination field of the mask is illuminated by illumination radiation at the operating wavelength $\lambda$ provided by the illumination system. The position and size of the illumination field determine the position and size of the effectively used object field OF.

Part of the pattern PAT lying in the illumination field is transferred onto the image field IF in the image plane with the aid of the projection lens in the manner described above. In the exemplary case, the pattern PAT should have a first region I with lines lying relatively tightly together and, next to it, a second region II with lines having a greater line spacing, i.e. a rougher structure. A dipole illumination is set at the illumination system, the dipole illumination setting being characterized by two illumination intensity maxima in the pupil plane of the illumination system that lie diametrically opposite one another in relation to the optical axis and completely off the optical axis. The pattern PAT acts as a diffraction grating for the illumination radiation produced therewith. Here, the angles of diffraction of the second region II with the larger grating constant (or smaller line density) are smaller than those of the first region I with the greater line density.

In accordance with the off-axis position of the illumination maxima of the dipole illumination, the zero order of diffraction "0" lies off the optical axis, at a normalized pupil coordinate of approximately −0.7 in the exemplary case (see FIG. 2). The off-axis position of the illumination intensity maximum is chosen in such a way here that the first order of diffraction $1_{II}$ associated with the second region II with the smaller line density lies substantially symmetrical to the optical axis on the opposite side of the pupil at a pupil coordinate PK=+0.7. The greater line density of the first region I leads to greater angles of diffraction, and so the associated first order of diffraction $1_I$ lies closer to the outer edge of the pupil, for example at a pupil coordinate of approximately 0.9. This marginal position of the first order of diffraction shows that the higher line density in the first region I lies closer to the resolution limit of the projection lens in the case of the chosen numerical aperture of the projection lens.

The different orders of diffraction are now transferred with the local pupil transmission TP corresponding to the position thereof in the pupil, and so different, pattern-specific values for the pupil transmission, and hence also for the exposure dose, emerge for the partial patterns with different line density. In the case of the projection lens represented by the curve A, in which no active intervention was undertaken for setting the intensity distribution in the exit pupil, the rougher structures of the second region II can be imaged with a relatively higher dose since the pupil transmission values associated with the zero order of diffraction and the associated first order of diffraction $1_{II}$, which are substantially the same amongst themselves, lie in the vicinity of the maximum value of the pupil transmission. By contrast, the pupil transmission $T_P$ for the first order of diffraction $1_I$ for the finer partial pattern, lying closer to the edge of the pupil, is significantly lower, and so the pattern-specific dose at the substrate is significantly lower than that for the rougher structures. In the exemplary case, this contributes to the associated lines in the exposed substrate having a line width that is significantly larger or smaller than that of the lines of the second region II that lie further apart. As a result, dose differences emerge, which may lead to significant variation in the critical line widths in the exposed substrate, as a result of which the imaging quality is impaired.

In the exemplary embodiment, a significant decrease in this unwanted effect can be achieved by virtue of the curve of the pupil transmission function or the intensity distribution in the exit pupil of the projection lens being set with the aid of separate measures. In the exemplary case of FIG. 2, the pupil transmission function is modified to the curve that is denoted by "B" and depicted by dashed lines such that the values of the pupil transmission are reduced in the region of the maximum values (i.e. where the zero and the first order of diffraction lie for the rougher structures) in comparison with the projection lens without active setting, to be precise more strongly than in the region in which the first order of diffraction $1_I$ of the finer structures lies. As a result, the difference in the pupil transmission for the differently dense lines reduces, and so the above-described disadvantageous effect becomes smaller or possibly remains below a critical threshold.

In the exemplary embodiment of FIGS. 1 and 2, this is achieved by a special type of transmission filtering in the vicinity of the pupil plane PPO of the projection lens, i.e. by an apodization method. To this end, an optical element PP in the form of a transparent plane-parallel plate is chosen, the plate being situated directly in front of the aperture stop AS in the optical vicinity of the pupil plane PPO of the projection lens PO. At least one optical surface of this optical element, the entrance surface S1 facing the object plane in the exemplary case, is chosen as correction surface. The optical element has an optically used region UA (see detailed figure), which, corresponding to the position of the optical element in the direct vicinity of the pupil plane, is substantially circular and includes the optical axis AX, and a marginal region lying outside of the optically used region, in which the holding structures for holding the optical element engage with the latter.

Diffraction structures DS are produced within the optically used region UA according to a predeterminable local distribution in such a way that, during operation of the projection exposure apparatus, the diffraction structures guide a component of the intensity of the rays of the imaging beam path incident on the diffraction structures into uncritical regions outside of the imaging beam path via diffraction. Here, in the exemplary case, the diffraction structures are arranged in such a way that local maxima of the diffraction intensity lie in those regions that correspond to the local maxima of the pupil transmission function (at PK=0.7 and PK=−0.7) such that the masking of light intensity there via diffraction is stronger than closer to the optical axis AX, for example. As a result of the locally irregular masking of radiation intensity via diffraction, the pupil transmission in these regions is reduced more strongly than in the vicinity of the optical axis (where there are no diffraction structures and therefore there is, in principle, no reduction in transmission), and so the above-described effect of making the pupil transmission more uniform or of reducing the variation in the pupil transmission arises. Since the optical element PP with a diffractive effect in regions brings about an at least partial correction of the intensity distribution in the exit pupil to the effect of a more uniform distribution, it is also referred to as a correction element PP.

In the exemplary case, the diffraction structures DS are designed in such a way that more than 40% or more than 60% or even more than 80% of the diffracted radiation does not reach as far as the image field IF and therefore it is not able to impair the image production either. In order to avoid diffracted radiation components reaching the image field over detours by way of reflection at inner surfaces of the projection lens, separate low-reflection radiation capture devices SI1, SI2 are attached in the interior of the projection lens in the example of FIG. 1. By way of example, these may be coated with a coating that absorbs light at the operating wavelength or may have any other radiation-absorbing design, for example by way of surface structuring. In the exemplary case, the radiation capture devices are arranged at a large distance of several centimetres from the correction element PP, and so possible heating of the radiation capture devices cannot reach as far as the correction element PP by way of thermal conduction. The masking of radiation components via diffraction acts largely free from absorption, particularly when designing the diffraction structures as phase gratings. As a result of this, it is possible to obtain masking of radiation intensity components, without there being a disadvantageous local element heating of the optical element PP that can only be controlled with difficulty.

Figure 3:
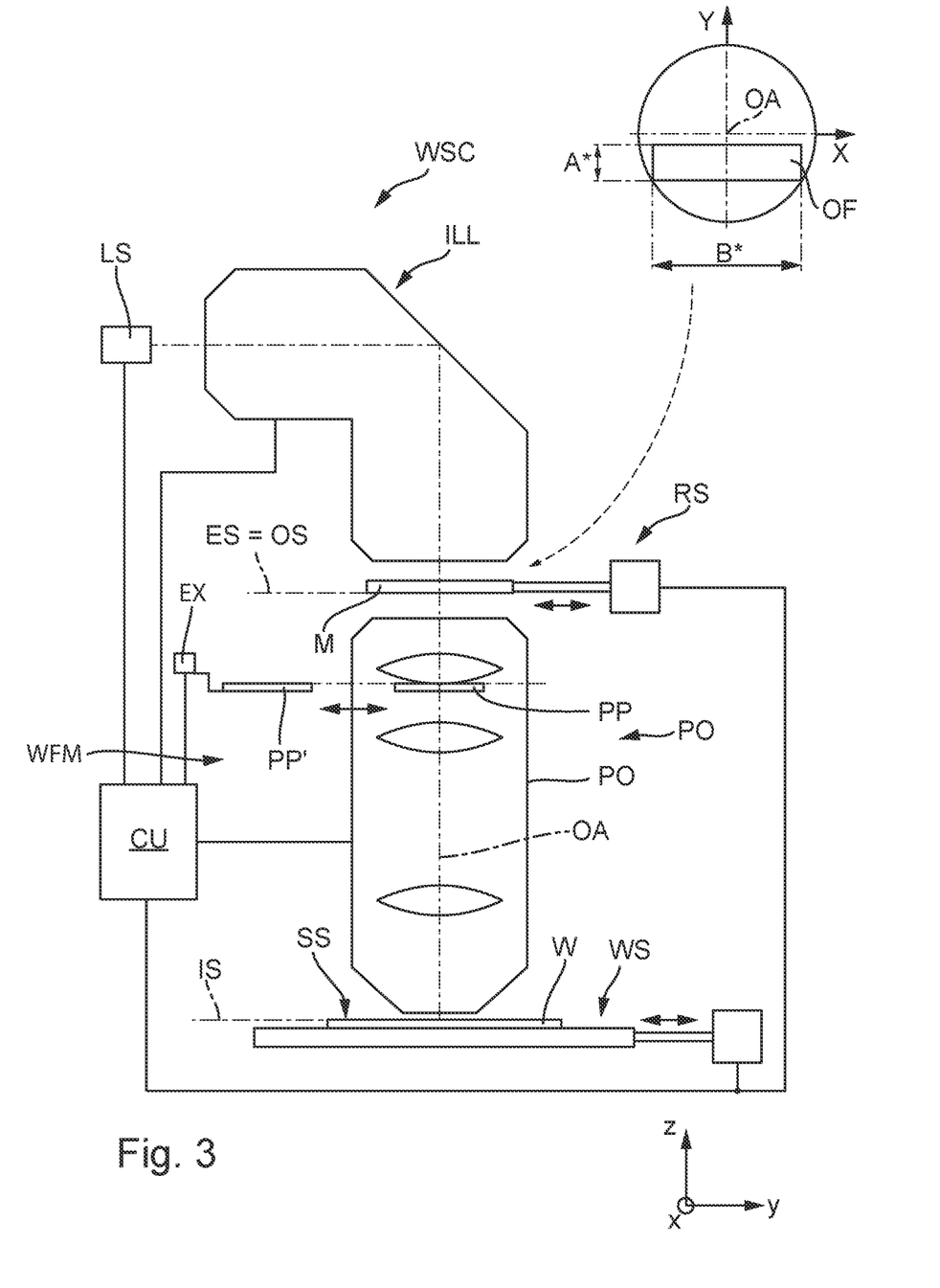
FIG. 3 shows an exemplary embodiment of a projection exposure apparatus.
Figure 4:
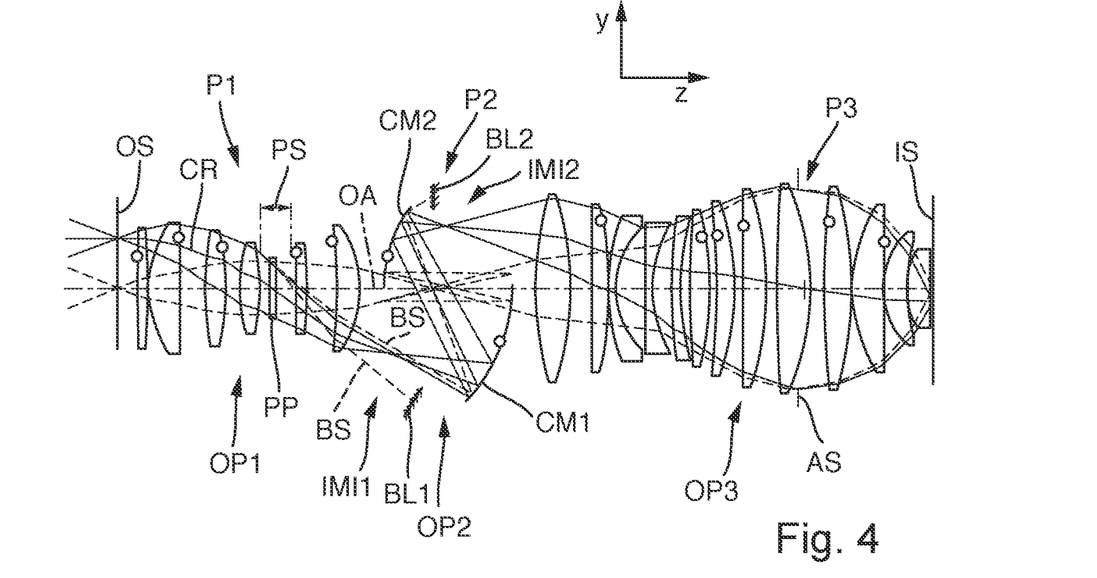
FIG. 4 shows a meridional section through an embodiment of a catadioptric projection lens having a diffractive correction element.

A further exemplary embodiment is explained on the basis of FIGS. 3 and 4. FIG. 3 shows an example of a microlithographic projection exposure apparatus WSC, which is employable in the production of semiconductor components and other finely structured components and which operates with light or electromagnetic radiation from the deep ultraviolet (DUV) range in order to obtain resolutions down to fractions of micrometres. An ArF excimer laser with an operating wavelength λ of approximately 193 nm serves as primary radiation source or light source LS. Other UV laser light sources, e.g. $F_2$ lasers with an operating wavelength of 157 nm or KrF excimer lasers with an operating wavelength of 248 nm, are also possible.

In the emergence surface ES thereof, an illumination system ILL disposed downstream of the light source LS produces a large, sharply delimited and substantially homogeneously illuminated illumination field, which is adapted to the desired properties of telecentricity of the projection lens PO arranged therebehind in the light path. The illumination system ILL has devices for adjusting different illumination modes (illumination settings) and it can be switched e.g. between conventional on-axis illumination with different degrees of coherence σ and off-axis illumination. By way of example, the off-axis illumination modes comprise an annular illumination or a dipole illumination or a quadrupole illumination or any other multi-polar illumination.

The optical components which receive the light from the laser LS and form illumination radiation from this light, which illumination radiation is directed to the reticle M, are part of the illumination system ILL of the projection exposure apparatus.

Arranged downstream of the illumination system is a device RS for holding and manipulating the mask M (reticle) in such a way that the pattern arranged at the reticle lies in the object plane OS of the projection lens PO, which coincides with the emergence plane ES of the illumination system and which is also referred to here as reticle plane OS. For the purposes of a scanning operation, the mask is movable in this plane in a scanning direction (y-direction) perpendicular to the optical axis OA (z-direction) with the aid of a scanner drive.

Following downstream of the reticle plane OS is the projection lens PO, which acts as a reduction lens and images an image of the pattern arranged at the mask M with a reduced scale, for example with the scale of 1:4(|β|=0.25) or 1:5(|β|=0.20), onto a substrate W coated with a photoresist layer, the light-sensitive substrate surface SS of which lies in the region of the image plane IS of the projection lens PO.

The substrate to be exposed, which is a semiconductor wafer W in the exemplary case, is held by a device WS which comprises a scanner drive in order to move the wafer synchronously with the reticle M perpendicular to the optical axis OA in a scan direction (y-direction). The device WS, which is also referred to as "wafer stage", and the device RS, which is also referred to as "reticle stage", are constituents of a scanner device which is controlled by way of a scan control device which, in the embodiment, is integrated in the central control device CU of the projection exposure apparatus.

The illumination field produced by the illumination system ILL defines the effective object field OF used during the projection exposure. In the exemplary case, the latter is rectangular, it has a height A* measured parallel to the scanning direction (y-direction) and it has a width B*>A* measured perpendicular thereto (in the x-direction). In general, the aspect ratio AR=B*/A* lies between 2 and 10, in particular between 3 and 6. The effective object field lies at a distance next to the optical axis in the y-direction (off-axis field). The effective image field in the image surface IS, which is optically conjugate to the effective object field, has the same form and the same aspect ratio between the height B and width A as the effective object field, but the absolute field dimension is reduced by the imaging scale β of the projection lens, i.e. A=|β|A* and B=|β|B*.

If the projection lens is designed and operated as an immersion lens, a thin layer of an immersion liquid is transilluminated during the operation of the projection lens, which thin layer is situated between the emergence surface of the projection lens and the image plane IS. Image-side numerical apertures NA>1 are possible during the immersion operation. A configuration as a dry lens is also possible; in this case, the image-side numerical aperture is restricted to values NA<1.

FIG. 4 illustrates an example of a projection lens PO that can be used in the projection exposure apparatus WSC.

FIG. 4 shows a schematic meridional lens section of an embodiment of a catadioptric projection lens PO with selected beams for elucidating the imaging beam path of the projection radiation extending through the projection lens during operation. The projection lens is provided as an imaging system with a reducing effect, for imaging, with a reduced scale, for example with the scale of 4:1, a pattern of a mask arranged in its object plane OS onto its image plane IS aligned parallel to the object plane. Here, exactly two real intermediate images IMI1, IMI2 are produced between object plane and image plane. A first lens part OP1 that is constructed from transparent optical elements only and is therefore purely refractive (dioptric) is designed in such a way that the pattern of the object plane is imaged into the first intermediate image IMI1 in a magnified manner. It is imaged substantially without a change of size into a second intermediate image IMI2 with the aid of a catadioptric second lens part OP2. The second lens part consists of two concave mirrors CM1, CM2, the mirror surfaces of which face one another and are arranged in a near-field arrangement (near an intermediate image, distant from the pupil plane lying therebetween) in each case. A third, purely refractive lens part OP3 is designed to image the second intermediate image IMI2 with great reduction into the image plane IS. All lens parts have a common, straight-line (non-folded) optical axis OA (in-line system).

Pupil planes P1, P2, P3 of the imaging system respectively lie between the object plane and the first intermediate image, between the first and the second intermediate image and between the second intermediate image and the image plane, respectively where the chief ray CR of the optical imaging intersects the optical axis OA. The aperture stop AS of the system is attached in the region of the pupil plane P3 of the third lens part OP3. The pupil plane P2 within the catadioptric second lens part OP2 lies optically distant from the two concave mirrors.

If the projection lens is designed and operated as an immersion lens, a thin layer of an immersion liquid is transilluminated during the operation of the projection lens, which thin layer is situated between the emergence surface of the projection lens and the image plane IS. Immersion lenses with a comparable basic structure are exhibited in the international patent application WO 2005/069055A2, for example. Image-side numerical apertures NA>1 are possible during the immersion operation. A configuration as a dry lens is also possible; in this case, the image-side numerical aperture is restricted to values NA<1.

The positions of the (paraxial) intermediate images IMI1, IMI2 define field planes of the system which are optically conjugated to the object plane and to the image plane, respectively. In order to quantify the position of an optical element or of an optical surface in the beam path, use can be made of the subaperture ratio SAR, for example.

According to an elucidating definition, the subaperture ratio SAR of an optical surface of an optical element in the imaging beam path is defined as the quotient between the subaperture diameter SAD and the optical free diameter DCA in accordance with SAR:=SAD/DCA. The subaperture diameter SAD is given by the maximum diameter of a portion of the optical element illuminated by rays of a beam emanating from a given field point. The optically free diameter DCA is the diameter of the smallest circle about a reference axis of the optical element, wherein the circle includes that region of the surface of the optical element which is illuminated by all rays coming from the object field.

Accordingly SAR=0 applies in a field plane (object plane or image plane or intermediate image plane). SAR=1 applies in a pupil plane. Therefore, "near-field" surfaces have a subaperture ratio lying close to 0, while "near-pupil" surfaces have a subaperture ratio lying close to 1.

The optical closeness or the optical distance of an optical surface from a reference plane (e.g. a field plane or a pupil plane) is described by the so-called subaperture ratio SAR in this application. For the purposes of this application, the subaperture ratio SAR of an optical surface is defined as follows:

$$SAR = \text{sign } CRH(MRH/(|CRH|+|MRH|))$$

where MRH denotes the marginal ray height, CRH denotes the chief ray height and the sign function sign x denotes the sign of x, with sign 0=1 according to convention. The chief ray height is understood to mean the beam height of the chief ray of a field point of the object field with a maximum field height in terms of magnitude. Here, the ray height should be understood to be signed. The marginal ray height is understood to mean the ray height of a ray with a maximum aperture proceeding from the point of intersection between the optical axis and the object plane. This field point need not contribute to transferring the pattern arranged in the object plane—in particular in the case of off-axis image fields.

The subaperture ratio is a signed variable which is a measure for the vicinity in the beam path of a plane to a field or pupil. By definition, the subaperture ratio is normalized to values between −1 and +1, wherein the subaperture ratio is zero in each field plane and wherein the subaperture ratio jumps from −1 to +1, or vice versa, in a pupil plane. Therefore, a subaperture ratio with an absolute value of 1 determines a pupil plane.

Therefore, near-field planes have subaperture ratios lying close to 0, while near-pupil planes have subaperture ratios lying close to 1 in terms of magnitude. The sign of the subaperture ratio specifies the position of the plane upstream or downstream of a reference plane.

An optical element in the form of a transparent plane plate PP is arranged in the imaging beam path in the region of the first pupil plane P1 within a pupil-near space PS.

Figure 5:
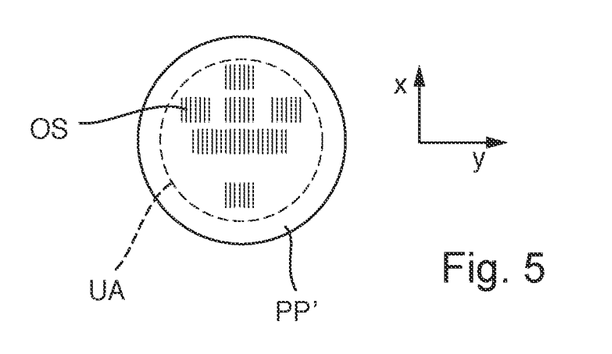
FIG. 5 schematically shows a plan view of the correction element from FIG. 4.

The optical effect of the plane plate is taken into account when constructing the optical design. The plane plate, including its mount, is designed as an interchange component and can be removed from the imaging beam path with the aid of an interchange device EX of the projection exposure apparatus and it can be replaced by a different plane plate with the same thickness for example. The other plane plate can be designed as a plate-shaped correction element PP' with diffraction structures in the optically used region UA. FIG. 5 shows a schematic plan view of a variant of such a correction plate with diffraction structures DS.

Peculiarities of the projection lens were taken into account when designing the diffraction structures, in particular when setting the direction of the dense lines.

The design of the projection lens has two real intermediate images IMI1, IMI2, which lie in the region of field planes of the projection lens. Such regions can be used for placing stray light stops, which ensure that stray light (e.g. scattered light and superaperture light) does not reach into the image field IF and does not reduce the imaging quality. FIG. 4 shows two stray light stops BL1, BL2 that serve as a radiation capture device. Just like the effective object field OF, the effective image field IF is rectangular with a long side extending parallel to the x-direction and a short side extending parallel to the y-direction. The extent can be 26 mm×5.5 mm, for example. The correction element PP is arranged in, or in the vicinity of, the first pupil plane P1, i.e. between the object plane OS and the first intermediate image IMI1. Therefore, according to the Fourier relationships between the location of the correction element and the subsequent field plane, the angle changes in the region of the correction element will translate into location changes in the region of the subsequent intermediate image plane.

It is considered to be advantageous to design the diffraction structures in such a way that the diffraction structures diffract in the direction of the short field direction, i.e. substantially parallel to the y-direction (scanning direction). What this can achieve is that even rays that originate from an opposite field edge already leave the intermediate image at moderate diffraction angles and are able to be masked via a field stop (stray light stop) (see the dashed diffracted rays BS in FIG. 4). It would also be possible to align the lines of the diffractive structures parallel to the y-direction such that the diffraction structures diffract in the direction of the long field extent. However, this case would involve correspondingly larger angle changes and hence finer diffraction structures in order to achieve reliable masking via a field stop. By way of example, a sine of the diffraction angle of 0.41 can be involved in order to reliably diffract out of the effective image field.

If use is made of the operating wavelength of approximately 193 nm, what can be derived from this estimate is that dense lines with a period of 255 nm or less, for example, diffract sufficiently strongly in order to achieve reliable masking. The lines of the diffraction structures are oriented along the long field extent since the diffraction is then effectuated perpendicular thereto, i.e. along the short field direction, just as desired.

In principle, diffraction structures also can be applied to optical elements with a near-field arrangement, i.e. optical elements that are arranged optically in the vicinity of a field plane (e.g. object plane or intermediate image plane). Then, the diffracted radiation can be captured with the aid of the aperture stop AS, for example.

In addition to line structures with mutually parallel straight lines, it is also possible to use circular structures as diffraction structures; this may be advantageous on account of the typically approximately circular pupil.

Figure 6:
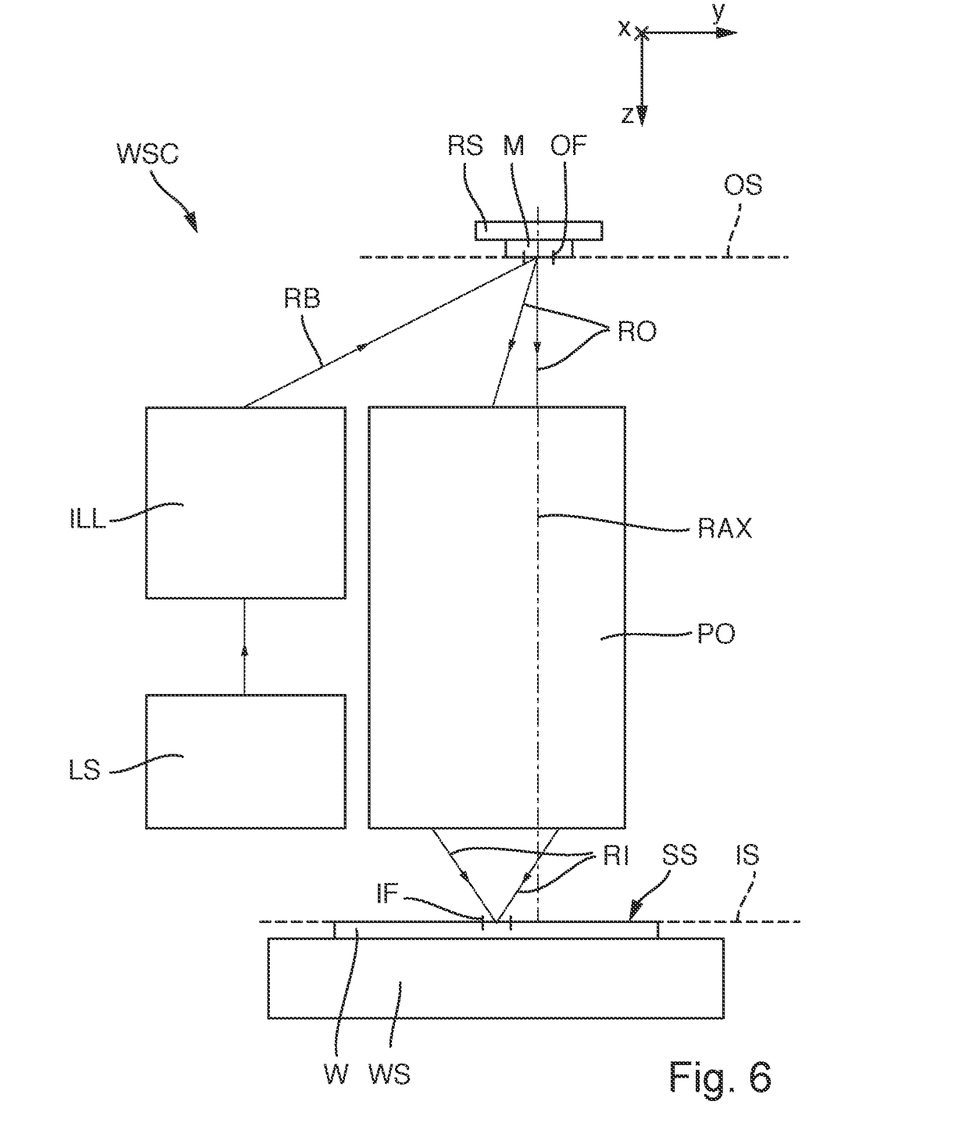
FIG. 6 shows an exemplary embodiment of a projection exposure apparatus for EUV lithography.
Figure 7:
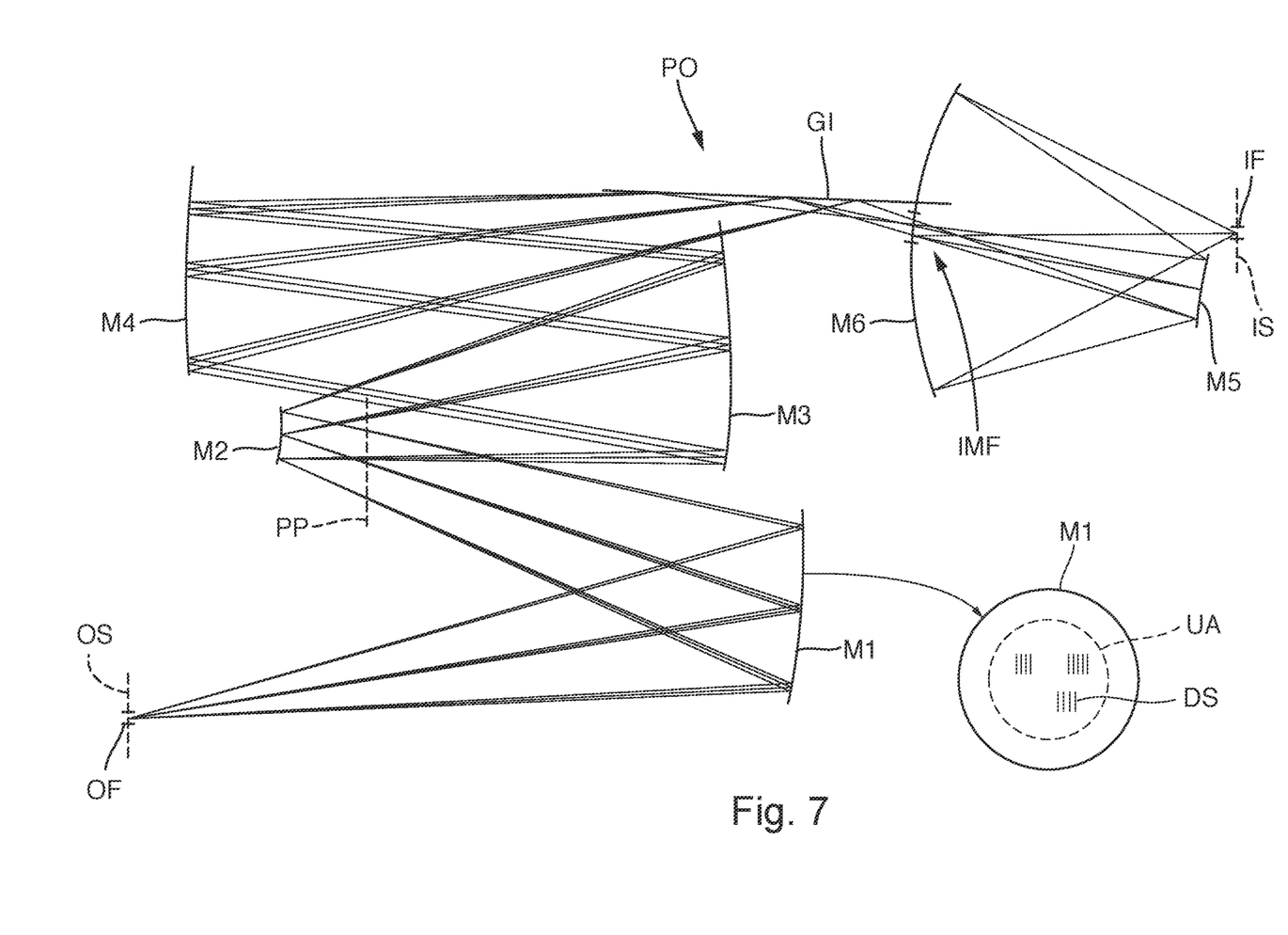
FIG. 7 shows a section through an embodiment of a reflective projection lens having a reflective diffractive correction element.

Use of the claimed disclosure is not restricted to the above embodiments designed for the DUV range. Instead, other operating wavelengths, such as in the EUV range, can also be used. FIG. 6 shows an exemplary embodiment of a projection exposure apparatus for EUV lithography and FIG. 7 shows a section through an embodiment of a reflective projection lens suitable for the EUV range and having a reflective diffractive correction element.

The microlithography projection exposure apparatus WSC of FIG. 6 comprises a radiation source LS, an illumination system ILL and a projection lens PO. The radiation source LS generates primary radiation in a wavelength range around an operating wavelength $\lambda$, wherein this radiation is guided as radiation beams RB into the illumination system ILL. The illumination system ILL changes the primary radiation by expansion, homogenization, changing the ray angle distribution, etc. and thereby generates at its output an illumination radiation beam RB, which impinges on a reflective reticle or mask M, which bears or produces a pattern to be imaged. The term "reticle" or "mask" generally denotes a reflective pattern producing device suitable for producing a pattern.

The projection lens PO is an optical imaging system designed for imaging the pattern arranged in its object plane OS into an image plane IS optically conjugate with respect to the object plane. The radiation passes through the projection lens and impinges in the region of the image plane IS on the surface SS of a substrate W in the form of a semiconductor wafer carried by a substrate holding device WS. The radiation running from the radiation source to the reticle is generally also designated as illumination radiation, while the radiation running from the reticle to the substrate is often designated as imaging radiation or projection radiation.

The projection lens PO defines a reference axis RAX. The object field OF is centred with respect to the reference axis in the Y direction. The optical elements of the imaging system can be decentred with respect to the reference axis.

In the case of the example, the radiation source LS is an EUV radiation source that generates radiation in a wavelength range of between approximately 5 nm and approximately 30 nm, in particular between approximately 10 nm and approximately 20 nm. The radiation source can be designed, in particular, such that the operating wavelength is in the range of approximately 13.5 nm. Other wavelengths from the EUV range (e.g. in the range of approximately 6.7 nm to 6.9 nm) are also possible.

The illumination system ILL comprises optical components which are designed and arranged such that illumination radiation having a maximally homogenous intensity profile and defined ray angle distribution is generated. In the case of the example, all the optical components of the illumination system which are provided for beam guiding and/or beam shaping are purely reflective components (mirror components).

The mask is held by a mask holding device RS. The illumination radiation is reflected by the reflective reticle M in the direction of the projection lens PO and modified with regard to angle distribution and/or intensity distribution. That radiation which passes through the projection lens to the substrate W forms the imaging beam path, of which schematically two rays RO are illustrated at the object side of the projection lens (between reticle and projection lens) and two rays RI converging to an image point in the image field IF are illustrated on the image side (between projection lens and a substrate). The angle formed by the converging rays RI at the image side of the projection lens is related to the image-side numerical aperture NA of the projection lens. The image side numerical aperture can be, for example, 0.1 or more or 0.2 or more or 0.3 or more than 0.4 or more.

The projection lens PO is designed to transfer the pattern from the region of the object field OF of the projection lens on a demagnifying scale into the image field IF of the projection lens. The projection lens PO demagnifies by a factor of 4; other demagnification scales, for example 5 fold demagnification, 6 fold demagnification or 8 fold demagnification or else less intense demagnifications, for example 2 fold demagnification, are also possible.

Embodiments of projection lenses for EUV microlithography use reflective optical elements only (catoptric system). A projection lens typically has at least three or at least four mirrors. Exactly six mirrors curved are often advantageous. Given an even number of curved mirrors, all the mirrors can be arranged between object plane OS and image plane IS and these planes can be oriented parallel to one another, thereby simplifying the integration of the projection lens in a projection exposure apparatus.

In order to facilitate the description of the projection exposure apparatus, a Cartesian x, y, z coordinate system is indicated in FIG. 1. In this case, the z direction is parallel to the reference axis RAX, and the x-y plane is perpendicular thereto, that is to say parallel to the object plane and to the image plane, the y direction lying in the plane of the drawing in the illustration.

The projection exposure apparatus WSC is of the scanner type. The reticle M and the substrate W are moved synchronously parallel to the y direction during the operation of the projection exposure apparatus, such that temporally successively different regions of the reticle are transferred to the moving wafer. Embodiments of the stepper type are also possible.

FIG. 7 shows a schematic section through an embodiment of a projection lens PO with the y z plane as sectional plane. The projection lens includes a total of six mirrors M1 to M6 with curved mirror surfaces used at or near normal incidence and one grazing incidence mirror GI having a plane reflecting surface. In each case only the calculated reflection surfaces of the mirrors M1 to M6 and GI are illustrated. The mirrors of the real projection lens are generally larger than the reflection surfaces actually used. The mirror system designed for step-and scan operation operates with a rectangular (or curved) OF and attains an image side numerical aperture NA=0.45. The image field IF has a field size of 2 mm×26 mm, where the shorter dimension (2 mm) running parallel to the scan direction is designated as scan slit length, too, and the longer dimension measured parallel to the x axis is also designated as scan slit width. Besides the six curves mirrors and the grazing incidence mirror GI, the projection lens has no optical elements serving for beam guiding and/or beam shaping, that is to say is a catoptric (all reflective) imaging system. Details regarding the optical parameters of the embodiment in FIG. 6 are disclosed in description and tables of German patent application DE 10 2012 202 675 A1, which is incorporated into the present application by reference.

Radiation coming from the illumination system ILL firstly impinges on the reflective mask M arranged in the object plane. The reflected radiation then impinges, in this order, on concave first mirror M1, on convex second mirror M2, on concave third mirror M3, on concave fourth mirror M4, on flat grazing incidence mirror GI, on convex fifth mirror M5 and on sixth mirror M6, which has a concave mirror surface which faces the image plane IS and by which the impinging radiation is reflected and focused onto the image plane IS. A real intermediate image IMI is formed behind (downstream of) grazing incidence mirror GI between fourth and fifth mirrors M4, M5 in a region of a hole in sixths mirror M6. A pupil plane PP within the projection lens is located optically and geometrically between the second mirror M2 and the third mirror M3.

All the reflection surfaces of the mirrors M1 to M6 and GI of the projection lens PO are embodied as static freeform surfaces. In this case, a "freeform surface" is a rotationally asymmetrical (non rotationally symmetrical) surface, wherein the surface coordinates of the rotationally asymmetrical surface preferably deviate by at least one wavelength (operating wavelength) from a best matched rotationally symmetrical surface. A static freeform surface is understood to be a freeform surface which is not actively changed in terms of its form during the operation of the imaging system. Of course, a static freeform surface can be displaced overall for adjustment purposes. Embodiments with less freeform surfaces or no freeform surfaces (only rotationally symmetric surfaces) are possible.

One single mirror of the projection lens or more than one mirror of the projection lens can be selected (or chosen) to serve as correction element so that the reflective optical surface is configured as a correction surface by producing diffraction structures in an optically used region of the correction surface according to a predeterminable local distribution. If, for example a correction optically near to a pupil plane is desired, convex second mirror M2 can be selected. Curved mirrors M1 and/or M4 can be selected if influence is desired in an intermediate position or optically nearer to a field plane.

The mirror(s) selected for the correction are configured as an exchangeable mirror meaning that the mirror can be exchanged for a similar mirror (similar optical base parameters) without dismounting the entire frame of the projection lens. In the example of FIG. 7 first mirror M1 is selected. The double arrow illustrates that first mirror M1 is constructed as an exchangeable mirror.

As illustrated schematically in the detail figure, diffractive structures DS are produced within the optically used region UA of the first mirror M1 according to a predeterminable local distribution in such a way that, during operation of the projection exposure apparatus, the diffraction structures guide a component of the intensity of the EUV rays of the imaging beam path incident on the diffraction structures into uncritical regions outside of the imaging beam path via diffraction. The rays coupled out of the projection beam path are absorbed at a low-reflection radiation capture device SI1.

Due to the operating wavelength $\square$ in the EUV range (e.g. about 13.5 nm or about 6.7 nm) the diffractive (diffracting) structures are typically manufactured to have line spacings finer than those suitable for DUV systems. Line spacings can be in the order of some tens of nanometers down to ten nanometers of less, such as one or two or three or five nanometers.

Lithographic methods can be used to generate the diffractive structures. For example, nanoimprint lithography can be used. Nanoimprint lithography is a method of fabricating nanometer scale patterns. It is a simple nanolithography process with low cost, high throughput and high resolution. It creates patterns by mechanical deformation of imprint resist and subsequent processes. The imprint resist is typically a monomer or polymer formulation that is cured by heat or UV light during the imprinting. Adhesion between the resist and the template is controlled to allow proper release. Diffractive structures can thereby be generated on and/or in the multilayer reflective coating forming the reflective surface of an EUV mirror. EUV absorbing material can be used to form the diffractive structures.

As an alternative, a direct self assembly (DSA) method can be used. Directed self-assembly (DSA) is a type of directed assembly which utilizes block co-polymer morphology to create lines, space and hole patterns, facilitating for accurate control of feature shapes. DSA uses surface interactions as well as polymer thermodynamics to finalize the formation of the final pattern shapes.

Embodiments of projection lenses consisting of curved mirrors only (i.e. projection lenses without grazing incidence mirrors) are likewise possible. An example is shown in DE 10 2015 223 795 A1.

Aspects of the disclosure were explained using the example of microlithographic projection exposure methods and microlithographic projection lenses. The concepts can also be transferred to other imaging methods and imaging systems. Consequently, an imaging method for imaging a region of an object to be imaged from an object plane into an image plane of an optical imaging system optically conjugate to the object plane via radiation of an operating wavelength λ is also disclosed, the imaging method including the following steps: holding the object in such a way that the region of the object to be imaged is arranged in an object field of the object plane of the optical imaging system; imaging the region of the object to be imaged onto an image field lying in the image plane with the aid of the optical imaging system, wherein all rays that contribute to the image production in the image field form an imaging beam path in the optical imaging system, wherein the following steps are carried out for setting a local intensity distribution in an exit pupil of the optical imaging system: choosing at least one optical surface of an optical element of the optical imaging system as a correction surface and producing diffraction structures in an optically used region of the correction surface according to a predeterminable local distribution in such a way that, during operation, the diffraction structures guide a component of the intensity of the rays incident on the diffraction structures into uncritical regions outside of the imaging beam path via diffraction.

What is claimed is:

1. A system, comprising:
a projection lens comprising a plurality of optical elements in a beam path of a working wavelength of electromagnetic radiation to image a pattern arranged in an object surface of the projection lens into an image surface of the projection lens via the operating wavelength of the electromagnetic radiation, the plurality of optical elements comprising a replaceable optical element;
a correction optical element; and
an interchange device configured to replace the replaceable optical element with the correction optical element,
wherein:
the correction optical element comprises a body comprising a surface which comprises regions consisting of diffraction structures configured to diffract an operating wavelength of electromagnetic radiation;
the regions of the surface of the correction element consist of diffraction structures comprise a first region of the surface of the correction element and a second region of the surface of the correction element;
the first region of the surface of the correction element consists of first diffraction structures having a first density of diffraction structures;
the second region of the surface of the correction element consists of second diffraction structures having a second density of diffraction structures;
the second density of diffraction structures is different from the first density of diffraction structures; and
the operating wavelength of the electromagnetic radiation is in the DUV range.

2. The system of claim 1, wherein more than 5% of the surface of the correction element does not carry any diffraction structures.

3. The system of claim 1, wherein at least some of the diffraction structures have a line spacing that is less than ten times the operating wavelength of the electromagnetic radiation.

4. The system of claim 1, wherein the first and second regions of the surface of the correction element lie next to regions of the surface without diffraction structures.

5. The system of claim 1, wherein the correction optical element is configured to have a locally varying transmission at the operating wavelength of the electromagnetic radiation.

6. The system of claim 1, wherein the correction optical element comprises a reflective optical element.

7. The system of claim 1, wherein the correction optical element comprises a plane parallel plate.

8. The system of claim 1, wherein the interchange device is configured to replace the replaceable optical element with the correction element so that the diffraction structures are in a vicinity of a pupil plane of the projection lens.

9. The system of claim 1, wherein the interchange device is configured to replace the replaceable optical element with the correction element so that the diffraction structures are configured to diffract a component of the operating wavelength of the electromagnetic radiation incident on the diffraction structures into uncritical regions outside the beam path of the operating wavelength of the electromagnetic radiation.

10. The system of claim 1, wherein the interchange device is configured to replace the replaceable optical element with the correction element so that the diffraction structures are configured to diffract more than 40% of the electromagnetic radiation of the operating wavelength incident on the diffraction structures into uncritical regions outside the beam path of the operating wavelength of the electromagnetic radiation.

11. The system of claim 1, wherein the interchange device is configured to replace the replaceable optical element with the correction element so that the diffraction structures are configured to set a local intensity distribution in an exit pupil of the projection lens due to the diffraction structures of the correction device.

12. The system of claim 1, wherein the replaceable optical element comprises a reflective optical element, and the correction element comprises a reflective optical element.

13. The system of claim 1, wherein the replaceable optical element comprises a reflective optical element comprising a freeform surface, and the correction element comprises a reflective optical element.

14. The system of claim 1, wherein the replaceable optical element comprises a plane parallel plate, and the correction element comprises a plane parallel plate.

15. The system of claim 1, wherein the projection lens is a dioptric projection lens.

16. The system of claim 1, wherein the projection lens is a catadioptric projection lens.

17. The system of claim 1, wherein the interchange device is configured to position the correction optical element in a predetermined location in the system.

18. The system of claim 1, wherein:
the system comprises first and second interchange components which are movable in and out of an imaging beam path of the projection lens;
the first interchange component comprises a mount holding the replaceable optical element; and the second interchange component comprises a mount holding the correction optical element.

19. The system of claim 1, wherein the surface of the correction optical element comprises a third region, and the third region does not carry any diffraction structures.

20. A system, comprising:
a projection lens comprising a plurality of optical elements in a beam path of a working wavelength of electromagnetic radiation to image a pattern arranged in an object surface of the projection lens into an image surface of the projection lens via the operating wavelength of the electromagnetic radiation, the plurality of optical elements comprising a replaceable optical element
a correction optical element; and
an interchange device configured to replace the replaceable optical element with the correction optical element,
wherein:
the correction optical element comprises a body comprising a surface which comprises regions consisting of diffraction structures configured to diffract an operating wavelength of electromagnetic radiation;
the regions of the surface of the correction element consist of diffraction structures comprise a first region of the surface of the correction element and a second region of the surface of the correction element
the first region of the surface of the correction element consists of first diffraction structures having a first density of diffraction structures;
the second region of the surface of the correction element consists of second diffraction structures having a second density of diffraction structures;
the second density of diffraction structures is different from the first density of diffraction structures; and
the operating wavelength of the electromagnetic radiation is in the EUV range.

21. The system of claim 20, wherein the correction optical element is reflective for EUV radiation, and at least some of the diffraction structures have a line spacing of at most ten nanometers.

22. The system of claim 20, wherein the projection lens is a catoptric projection lens.

23. The system of claim 20, wherein more than 5% of the surface of the correction element does not carry any diffraction structures.

24. The system of claim 20, wherein at least some of the diffraction structures have a line spacing that is less than ten times the operating wavelength of the electromagnetic radiation.

25. The system of claim 24, wherein the first and second regions of the surface of the correction element lie next to regions of the surface without diffraction structures.

26. The system of claim 20, wherein the first and second regions of the surface of the correction element lie next to regions of the surface without diffraction structures.

27. An apparatus, comprising:
an illumination system configured to illuminate an object surface with a working wavelength of electromagnetic radiation;
a projection lens comprising a plurality of optical elements in a beam path of the operating wavelength of the electromagnetic radiation to image a pattern arranged in the object surface into an image surface of the projection lens via the operating wavelength of the electromagnetic radiation, the plurality of optical elements comprising a replaceable optical element;
a correction optical element; and
an interchange device configured to replace the replaceable optical element with the correction optical element,
wherein:
the correction optical element comprises a body comprising a surface which comprises regions consisting of diffraction structures configured to diffract an operating wavelength of electromagnetic radiation;
the regions of the surface of the correction element consist of diffraction structures comprise a first region of the surface of the correction element and a second region of the surface of the correction element;
the first region of the surface of the correction element consists of first diffraction structures having a first density of diffraction structures;
the second region of the surface of the correction element consists of second diffraction structures having a second density of diffraction structures;
the second density of diffraction structures is different from the first density of diffraction structures; and
the operating wavelength of the electromagnetic radiation is in the DUV range.

* * * * *

UNITED STATES PATENT AND TRADEMARK OFFICE
CERTIFICATE OF CORRECTION

PATENT NO. : 11,906,904 B2
APPLICATION NO. : 17/496083
DATED : February 20, 2024
INVENTOR(S) : Toralf Gruner It is certified that error appears in the above-identified patent and that said Letters Patent is hereby corrected as shown below:

In the Specification

Column 9, Line 28, after "if" insert -- $|v|$ --.

Column 10, Line 60, delete "and a" insert -- and $\alpha$ --.

Column 11, Line 15, after "$\Delta I \approx 2\pi h/\lambda$" insert -- . --.

In the Claims

Column 25, Line 13-14, Claim 20, delete "element" insert -- element; --.

Signed and Sealed this
Seventh Day of May, 2024

Katherine Kelly Vidal
*Director of the United States Patent and Trademark Office*